United States Patent [19]

Gable et al.

[11] Patent Number: 4,471,308

[45] Date of Patent: Sep. 11, 1984

[54] METHOD OF DIAGNOSING COMPONENT FAILURE IN A DC VOLTAGE REGULATOR

[75] Inventors: Stewart V. Gable, Ypsilanti; Francis G. King, Birmingham, both of Mich.

[73] Assignee: Ford Motor Company, Dearborn, Mich.

[21] Appl. No.: 421,702

[22] Filed: Sep. 22, 1982

[51] Int. Cl.³ .............................................. G01R 31/02

[52] U.S. Cl. ............................ 324/416; 324/158 MG; 322/99

[58] Field of Search ........... 324/416, 158 MG, 158 D, 324/158 R; 322/99; 340/645; 361/18, 78

[56] References Cited

U.S. PATENT DOCUMENTS 4,019,120 4/1977 Fattic .......................... 324/158 MG
4,178,546 12/1979 Hulls et al. .................. 324/158 MG
4,222,005 9/1980 Naito ................................... 324/416

*Primary Examiner*—Michael J. Tokar
*Assistant Examiner*—Kevin D. O'Shea
*Attorney, Agent, or Firm*—Paul K. Godwin, Jr.; Sanborn, Robert D.

[57] ABSTRACT

The determination of specific faulty components in an automotive type DC voltage regulator is accomplished by detecting the presence or absence of harmonic frequencies, of the base operating frequency of an associated DC voltage generator, on terminals of the regulator in its operating environment.

12 Claims, 9 Drawing Figures

Terminal Sensed: A
Defect: Q1a Open
Symptom: No Charging By Alternator
Test Results: No Harmonics Detected
Normal
Defect
25.000 MV
Mag
0.0
0.0
HZ
6.000 K Terminal Sensed: 5
Defect: Q1a Open
Symptom: No Charging By Alternator
Test Results: No Harmonics Detected
Normal
Defect
3.000 MV
Mag.
0.0
0.0
HZ
6.000 K

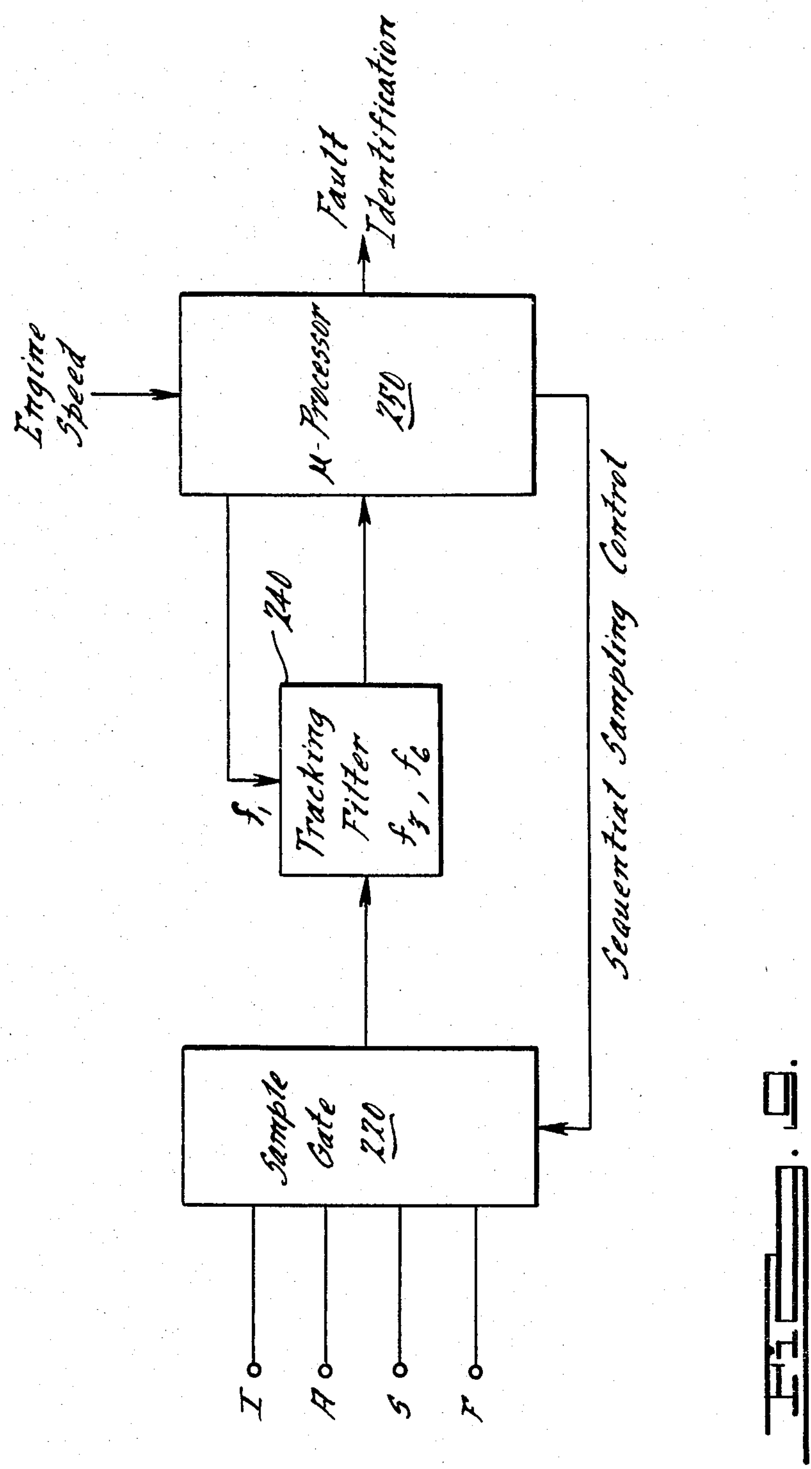
Fault
Identification
Engine
Speed
μ-Processor
230
240
f1
Tracking
Filter
Sequential Sampling Control
Sample
Gate
220
I
A
S
F

METHOD OF DIAGNOSING COMPONENT FAILURE IN A DC VOLTAGE REGULATOR

BACKGROUND OF THE INVENTION

1. Field of the Invention

The present invention is directed to the field of diagnostic methods and more specifically to the area of diagnosing component failure by sensing the presence or absence of certain harmonic frequencies at the external terminal connections of an automotive type DC voltage regulator operating in combination with a mechanically driven DC generator.

2. Description of the Prior Art

Solid state type DC voltage regulators are commonly employed in automotive vehicles to provide voltage level output control for associated DC voltage generators that are mechanically driven by associated vehicle engines.

The generators provide both system voltage to the vehicle and charging current to associated storage batteries.

Conventionally, whenever a component within the regulator fails, the complete regulator unit is often replaced. This often occurs since a fair amount of electronic troubleshooting skill is necessary in order to pinpoint the individual faulty component. While manufacturers may have equipment and personnel to perform lengthy resistance and voltage checks to diagnose the failed components, service garages and individual vehicle owners more than likely do not.

SUMMARY OF THE INVENTION

The present invention provides a method whereby a technician utilizing either auxiliary test equipment or onboard sensing devices can monitor the DC voltage regulator in its working environment and provide a rapid determination as to which of several most commonly failing components are defective and allow for that single component to be replaced. If the series of steps within the method determine that none of the most commonly failing components are defective, then the entire unit can be replaced and returned to a rebuilding facility. If, on the other hand, a faulty component is identified, then it is only necessary to replace that component in the regulator.

The present invention is also intended to be a quick and inexpensive method of confirming that the DC voltage regulator has been satisfactorily built by its manufacturer so as to meet operational specifications.

The method of the present invention is used to diagnose component failure in DC voltage regulators having terminals connected to a mechanically driven generator for sensing its output as well as controlling the field current to regulate the generator output. The method includes the steps of defining the fundamental frequency, as the rotational speed of the associated engine multiplied by the number of poles on the rotor of the alternator and the rotational drive ratio; providing means for sensing harmonics of the fundamental frequency; selectively connecting the sensing means to the terminals of the DC voltage regulator; and comparing the presence or absence of harmonic frequencies sensed at each terminal with a predetermined fault table to determine the faulty component in the DC voltage regulator.

By such comparison, a single component within the DC voltage regulator can be pinpointed as either being faulty or as having the wrong electrical characteristics.

BRIEF DESCRIPTION OF THE DRAWINGS

FIG. 9 is a block diagram of an electrical apparatus for implementing the present invention.

DETAILED DESCRIPTION OF THE PREFERRED EMBODIMENT

Figure 1:
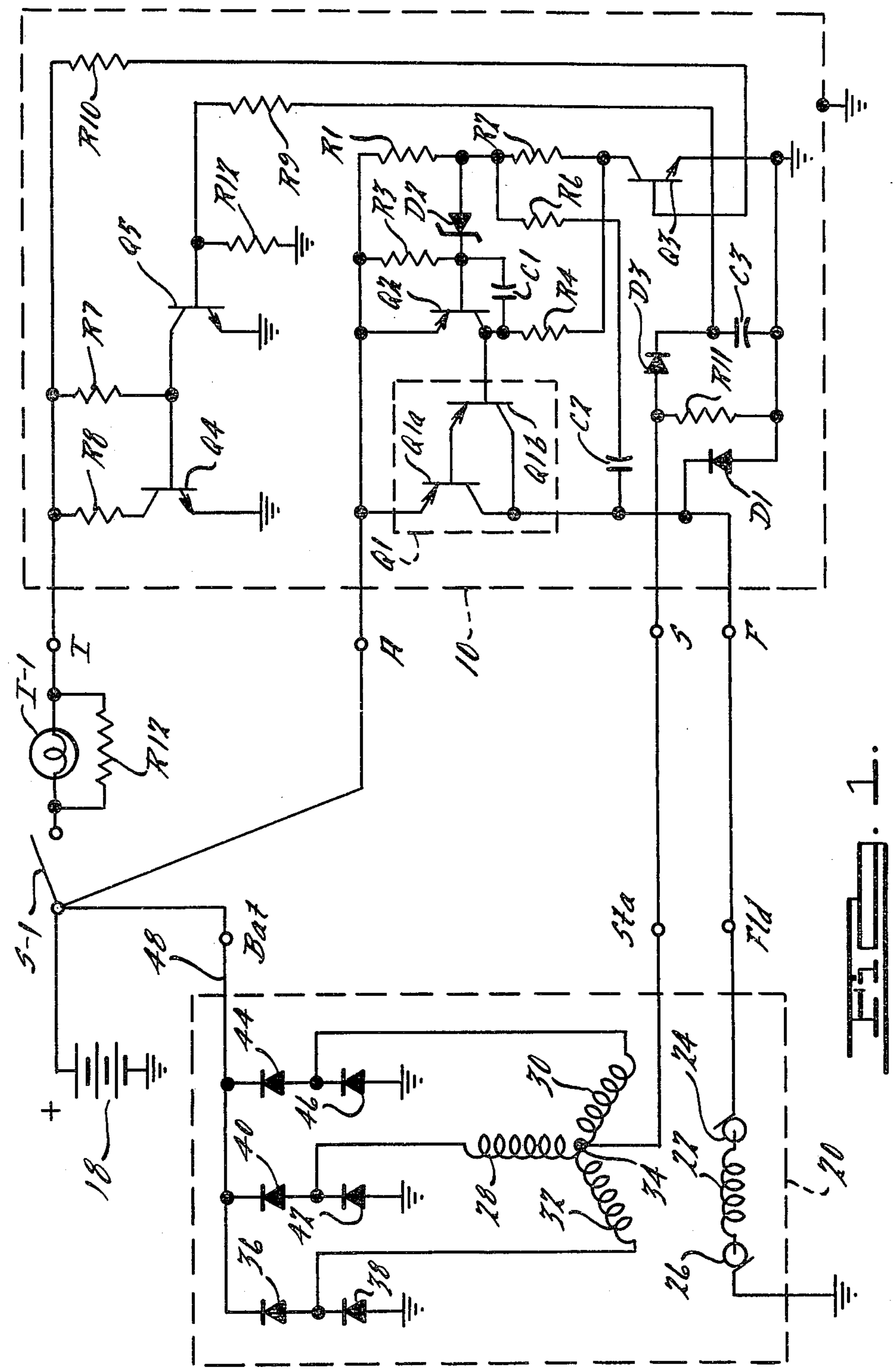
FIG. 1 is a schematic diagram illustrating a typical DC voltage regulator as it is connected to a mechanically driven alternator in a battery charging system for a vehicle.

A typical voltage regulator circuit is shown in FIG. 1 connected to operate in conjunction with a mechanically driven alternator (generator), a DC storage battery and a warning indicator lamp. As in most vehicular electrical systems, when the battery voltage is switch-connected to start an associated internal combustion engine (not shown), the charge on the battery is drawn down and, without recharge, would eventually be depleted. When the associated engine is energized and running, the alternator, which is mechanically driven by the engine through a pulley and belt system at a speed multiple of the engine speed, the alternator is controlled by the regulator to output a voltage higher than the rated value of the battery to recharge the battery. The voltage regulator controls the amount of field current going to the rotating field winding of the alternator. The DC voltage potential at the connection of the rectified output of the alternator and the battery is compared to a reference level, as determined within the regulator. The field current is controlled according to that comparison.

Specifically, the voltage reference and control circuit of the regulator 10 senses the alternator output voltage at the "BAT" connection on its "A" terminal of the regulator. The voltage reference and control circuit is defined by resistors R1, R2, R3, and R4, capacitor C1, zener diode D2 and transistor Q2. This circuit acts to modulate the conduction period for the output stage Q1 to thereby regulate the current supplied to the alternator field winding. Since the alternator output voltage is directly proportional to the speed and average field current, the voltage reference and control circuit acts as a feedback network by monitoring the output of the alternator 20 and modulating the field current to adjust the output.

The system regulation level is temperature compensated to insure direct charging characteristics for the battery. The temperature compensation is accomplished by means of the temperature coefficients of the zener diode D2 reference and the emitter-base junction of the transistor Q2 in the voltage reference and control circuit. The system voltage varies inversely with the ambient temperature due to those temperature sensitive elements.

The alternator stator winding potential is half-wave rectified and monitored by a solid state relay in the regulator which in turn switches off a warning indicator lamp I-1 when the rectified value of the stator voltage accumulates to a predetermined level.

In operation, the closing of an ignition switch S-1 energizes a warning lamp I-1 from the positive terminal of a battery 18 through resistor R8 and normally conductively biased transistor Q4. It also turns on the regulation section of the regulator 10 through resistor R10 and transistor Q3. With Q3 in a conducting state, a calibrated resistor R1 and resistor R2 form a voltage divider network. A zener diode D2 is calibrated by selection to control the maximum voltage level that may be present at the base of Q2, which in turn controls the amount of field current that will be gated to flow in the Darlington transistor Q1 (formed from transistor pair Q1*a* and Q1*b*) and the field winding of the alternator 20. While the rotor field winding 22 of the alternator 20 is rotationally driven via the engine and field current is flowing via slip rings 26 and 24 an output voltage is induced in the stator windings 28, 30 and 32. As the alternator rotator speed increases from the initial startup, its output and the voltage at the stator terminal 34 increases from 0 to the system regulation level determined by the regulator 10. Three phases of AC voltage are generated across the stator windings as a result of being induced by the rotating field winding on the rotor. Each phase of AC voltage is fed to rectifier diodes having a common output connection on line 48, that is connected to the positive terminal of the battery 18 for providing charging current thereto as well as vehicle system power.

When the stator voltage at point 34 increases to a value of approximately 6.5 volts, and the half-wave rectified voltage across diode D3 is accumulated in capacitor C3, the solid state relay circuit defined by resistor R9, resistor R12, transistors Q5 and Q4, as well as resistors R7 and R8 cause the warming lamp I-1 to be de-energized by changing the base emitter bias at Q4.

Statistically, it has been found that the most common failures within the regulator 10 occur due to transistor Q1*a*, of the Darlington transistor Q1, opening; transistor Q1*a*, of the Darlington transistor Q1, shorting; transistor Q1*b*, of the Darlington transistor Q1, shorting; zener diode D2 undercompensating by having a low zener threshhold value; or capacitor C3 becoming open. The present invention is intended to identify those component failures when a system fault occurs, if in fact that fault is caused by one of those more commonly failing components.

Due to the fact that the rotor of the alternator 20 is driven at a particular rotational speed by the associated internal combustion engine, the rotational speed of the rotor determines the fundamental frequency "$f_0$" for the system. The fundamental frequency $f_0$ becomes a function of the engine speed and therefore may be determined by the following formula:

$$f_0=(S/60)\times r\times p$$

wherein S equals engine speed; r equals drive pulley ratio (2.9 in the exemplified embodiment); p equals number of poles on the rotor of the alternator (six in the exemplified embodiment). Therefore, for an engine speed of 1,000 rpm, the base frequency $f_0$ will equal 290 hz. The nth harmonic of $f_0$ is defined to be n * $f_0$ and is denoted as fn.

The following table illustrates the frequency signatures of current measurements taken at the four terminals (I, A, S and F) of the regulator 10 under both normal conditions and various fault conditions.

TABLE I

Summary of Regulator Defects & Their Distinguishing Frequency Signatures

| Regulator Defect Characteristic | Frequency at which Distinguishing Spikes Occur | | | |
|---|---|---|---|---|
| | Term I | Term A | Term S | Term F |
| Normal | None | Multiple | $f_3$ | $f_6$ |
| Q1a open - light on - no field current | None | None | None | None |
| Q1a shorted - full charge | None | Multiple | $f_3$ | None |
| D2 under-calibrated - under charge | None | Multiple | None | $f_6$ |
| $C_3$ open - light on | $f_3$,$f_6$ | Multiple | $f_3$ | $f_6$ |
| Q1b shorted - random charging | None | $f_6$ | $f_3$ | $f_6$ |

Figure 2:
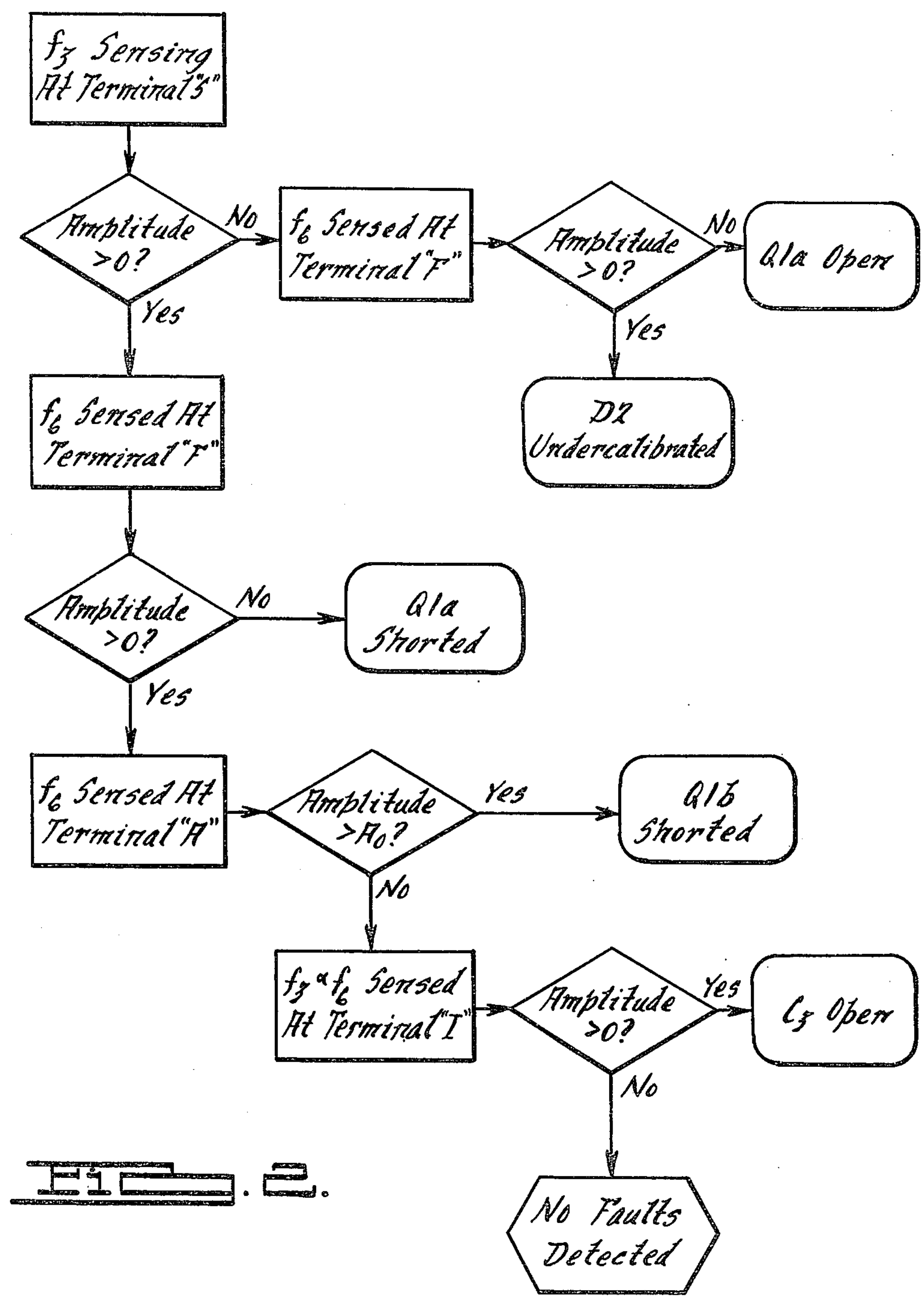
FIG. 2 is a flow diagram illustrating the method steps of the present invention.

Applicants observed that every fault resulted in a change of the existence of different harmonics measured at the four terminals of regulator 10, thus providing a viable diagnostic method. That method is illustrated in FIG. 2 as a flow diagram in which the steps of the method are illustrated.

Initially, terminal S of the regulator 10 is monitored to determine if the third harmonic $f_3$ is present. If the third harmonic $f_3$ is not present on the S terminal, the F terminal is monitored to determine if the sixth harmonic $f_6$ is present thereon. If the sixth harmonic is not present on the monitored F terminal, a determination is made that Q1*a* is open. In the event the sixth harmonic is sensed on the monitored F terminal, it is determined that zener diode $D_2$ is under-calibrated.

If, on the other hand, the third harmonic $f_3$ is sensed on the S terminal, the F terminal is monitored to determine if the sixth harmonic $f_6$ is present thereon. If the sixth harmonic is not present, it is determined that Q1*a* is shorted.

If, the third harmonic $f_3$ is sensed on the S terminal and the sixth harmonic is sensed on the F terminal, the A terminal is then monitored to determine if the sixth harmonic is present thereon. If the sixth harmonic is present on the A terminal at an amplitude greater than a predetermined value, it is determined that Q1*b* is shorted.

If, however, the sixth harmonic is not sensed at the terminal A to be greater than the predetermined amplitude, terminal I is then monitored to determine if both the third and sixth harmonics are present thereon. If both harmonics are sensed as being present on terminal I, a determination is made that C3 is open. If, on the other hand, the third and sixth harmonics are not sensed as being present on terminal I, the system will not produce an identification of a specific defect.

Figure 3:
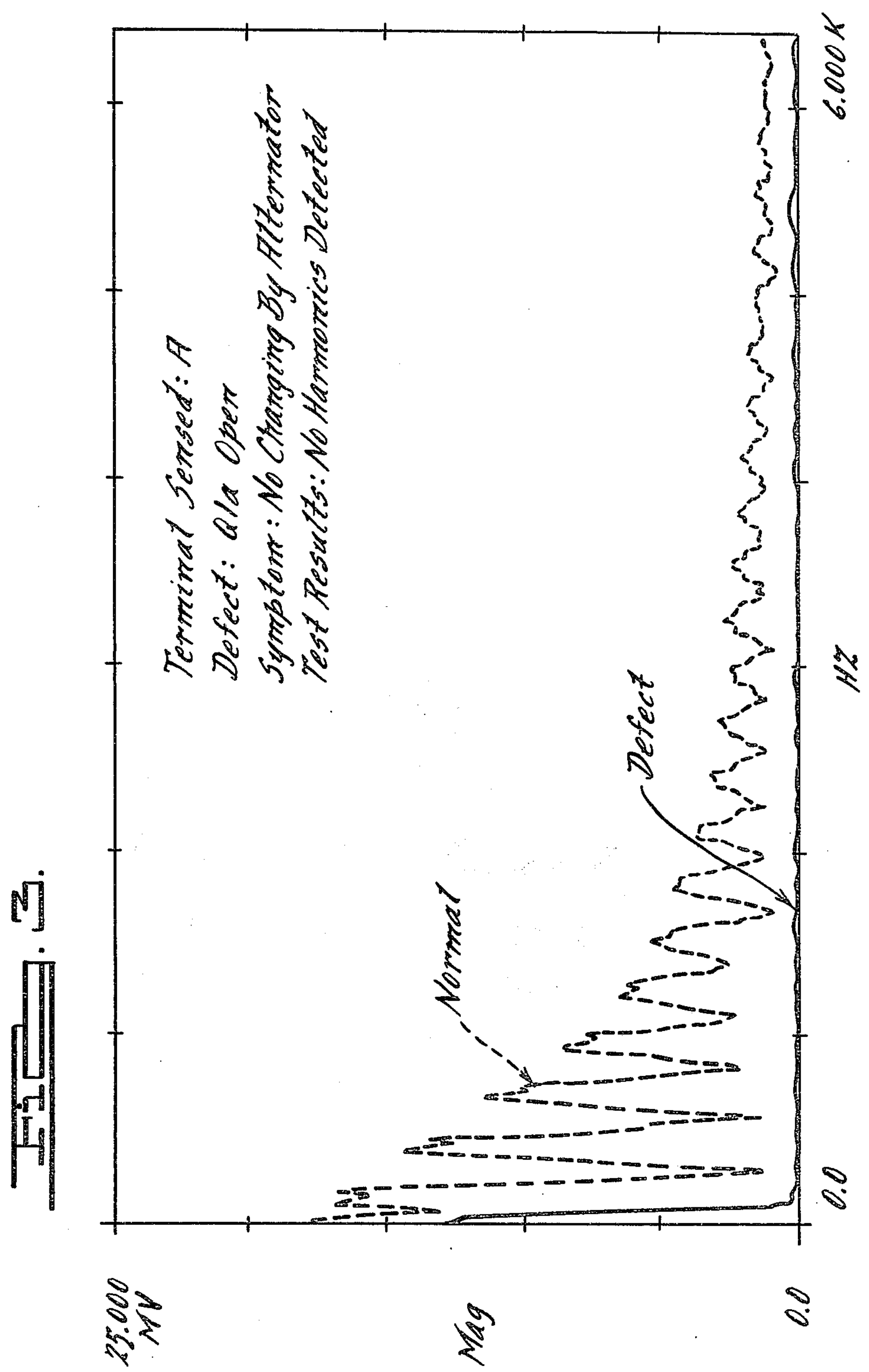
FIGS. 3–8 are frequency versus magnitude plots taken at each terminal of the voltage regulator indicating normal operation signals and signals occurring when the voltage regulator is operating with various defective components.
Figure 4:
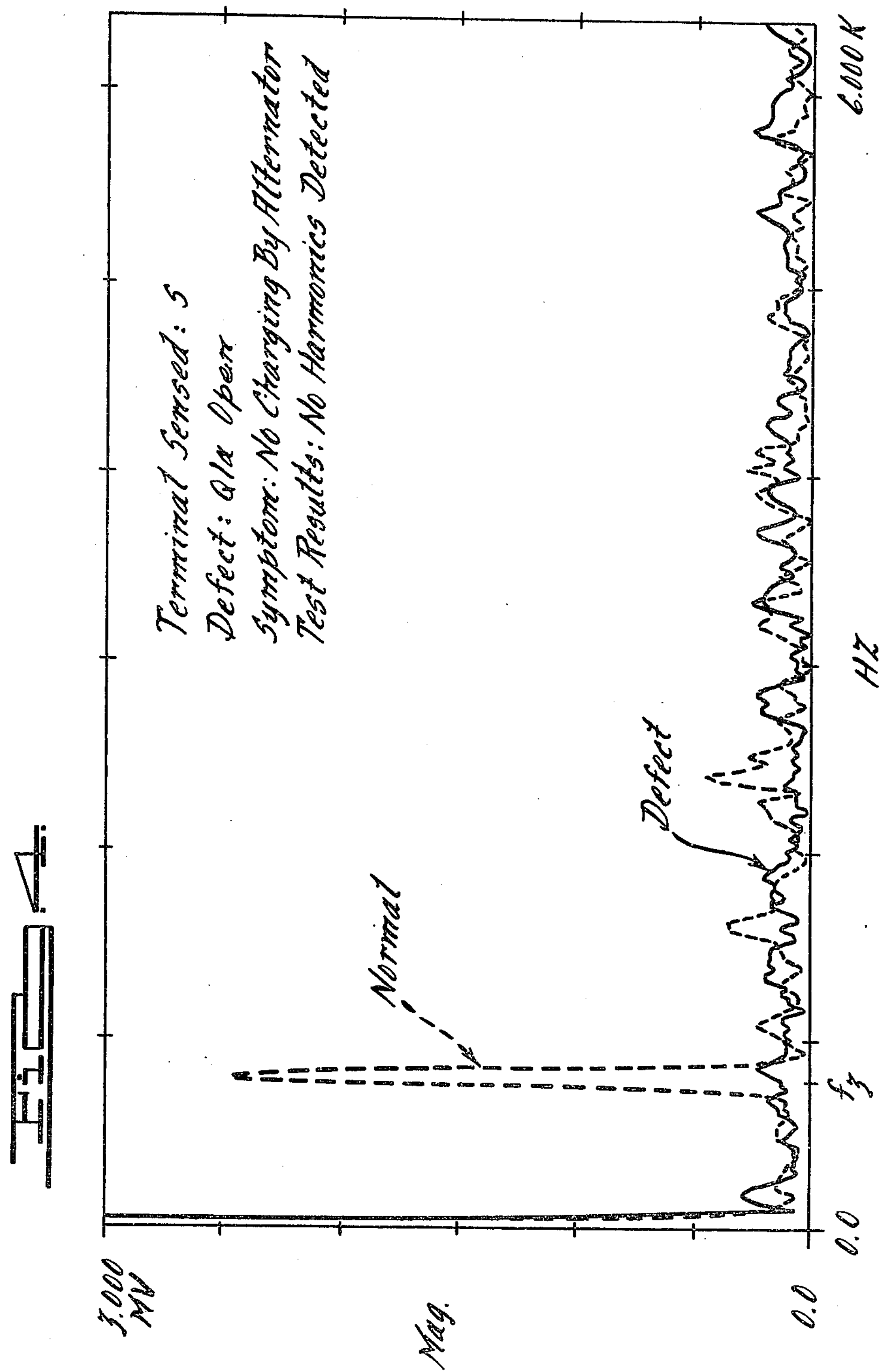
Figure 5:
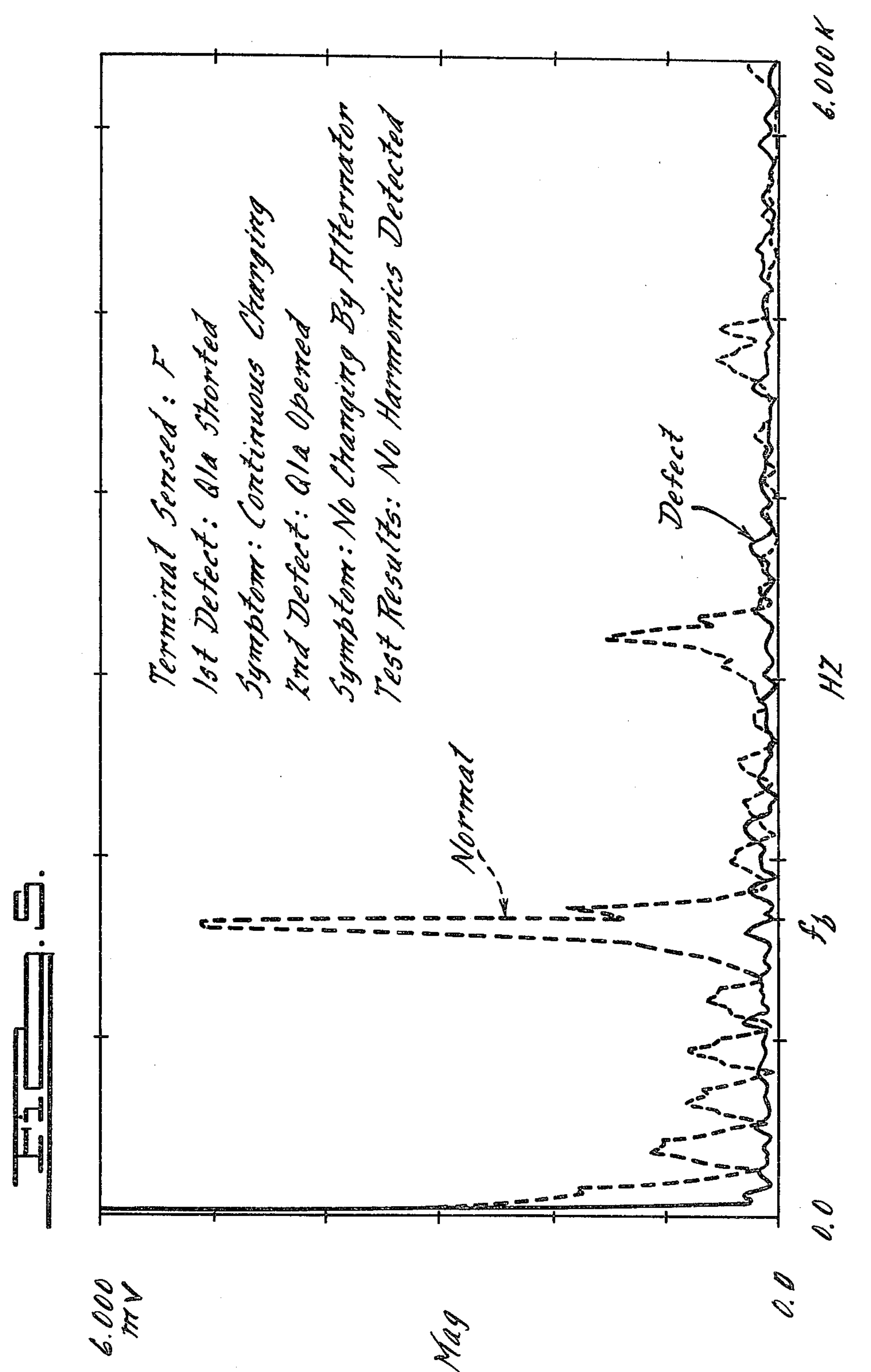

FIGS. 3–8 contain plots of amplitude values of various frequencies present on designated terminals of the alternator. FIGS. 3, 4, and 5 illustrate the affects of the component Q1*a* being open and resulting in a symptom of the alternator not charging the battery. The FIGS. 3, 4 and 5 compare the defect with the normal measurements taken at terminals A, S and F, respectively.

Figure 6:
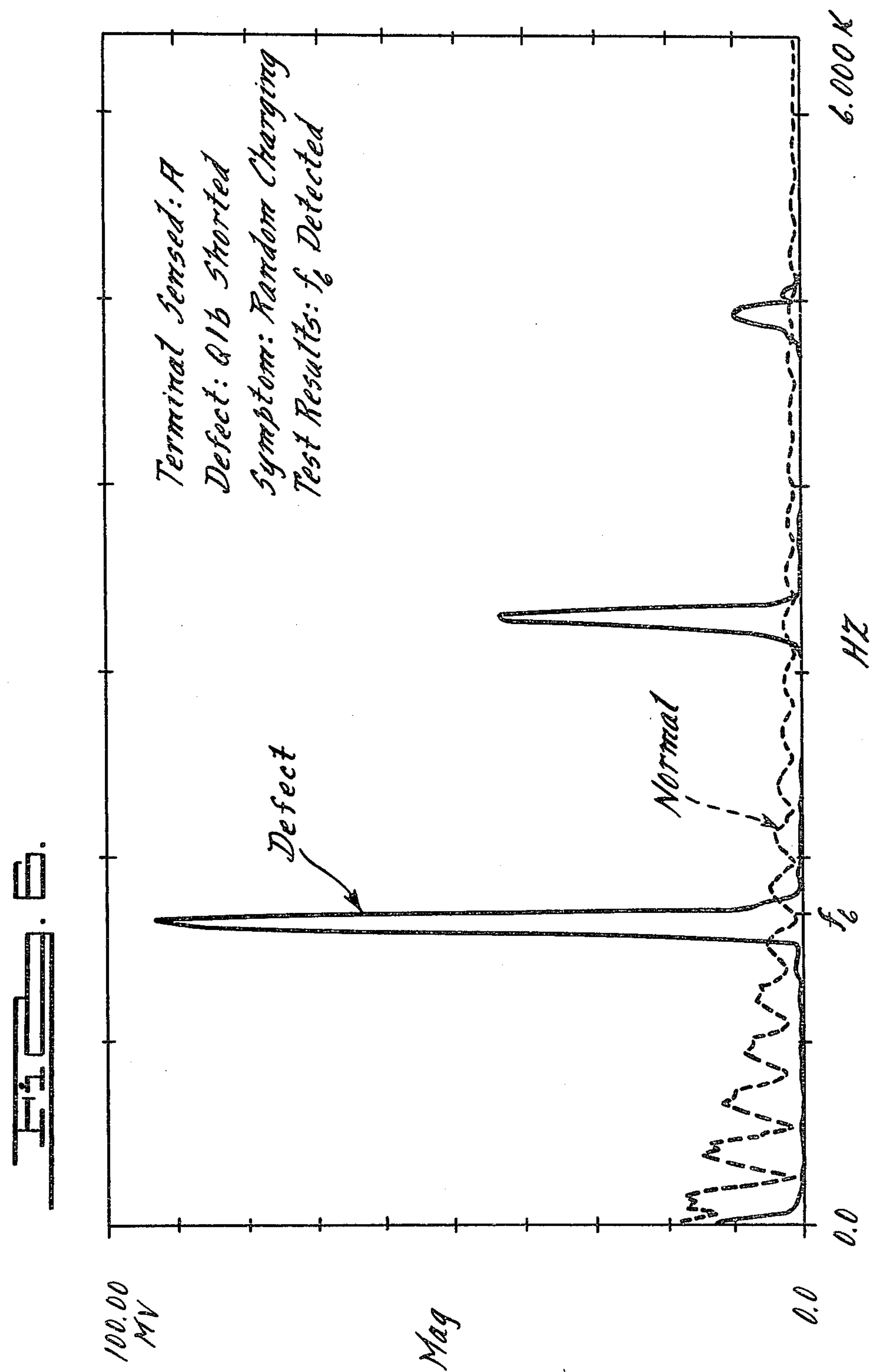

FIG. 6 illustrates the frequencies measured at terminal A when the component Q1*b* is shorted, as compared to normal frequency measurements measured at that terminal.

Figure 7:
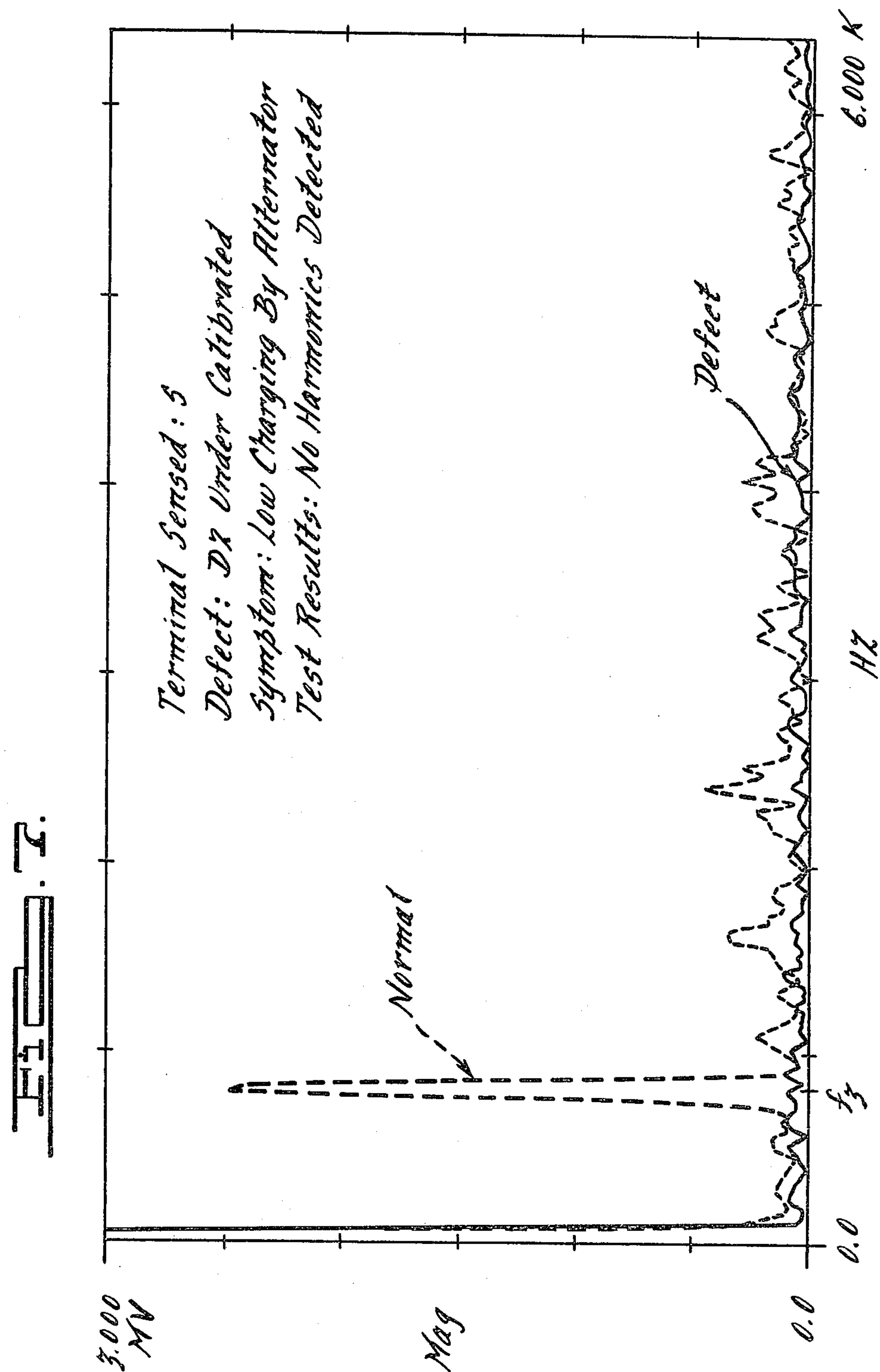

FIG. 7 plots the frequency measurements taken at terminal S at both the normal condition when the third harmonic is present and under the defect condition when no harmonics are present because diode D2 is under-calibrated.

Figure 8:
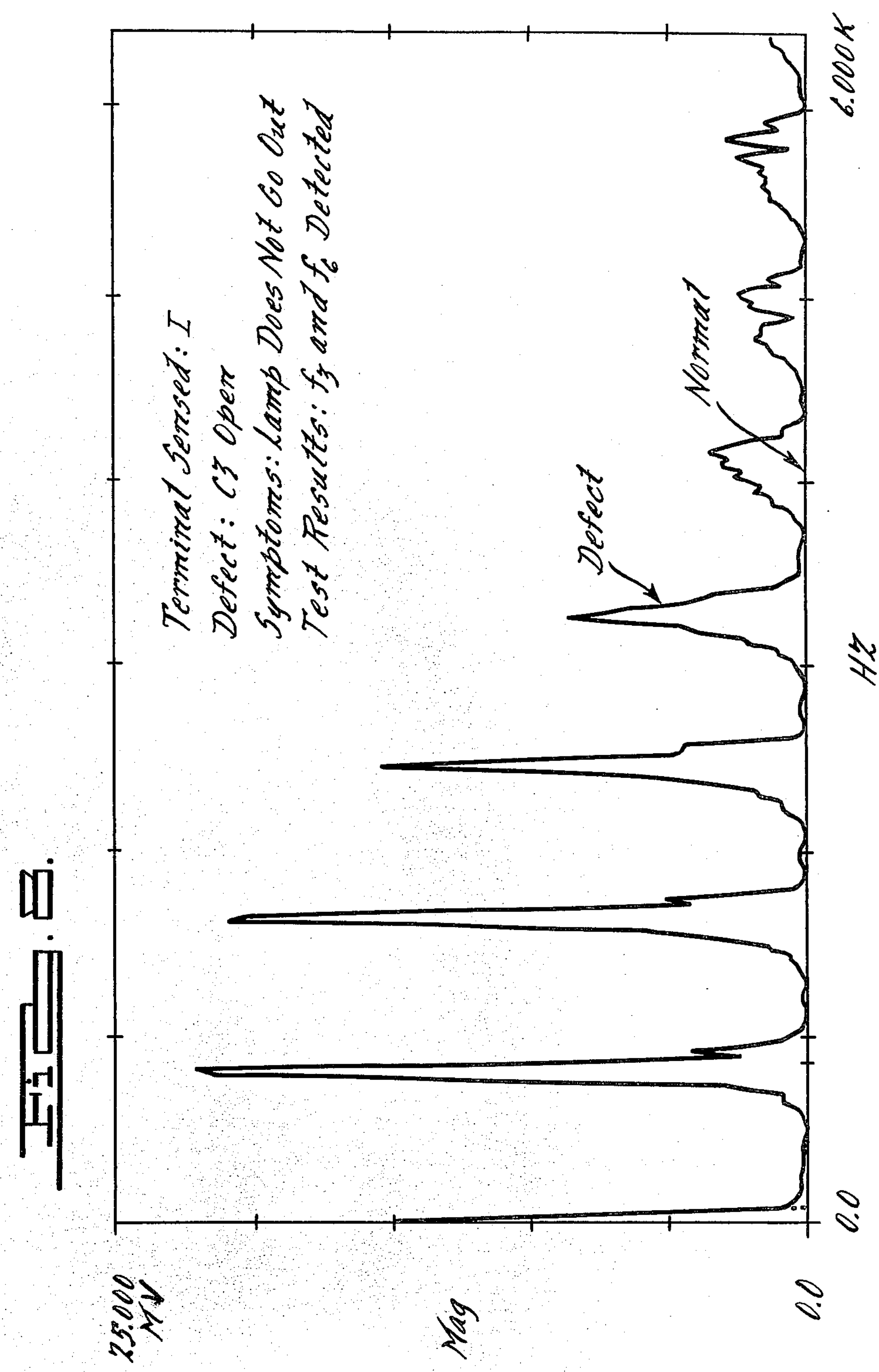

FIG. 8 is a plot of the frequency measurements taken at terminal I under normal conditions when no harmonics are detected and under defect conditions when component C3 is open, causing the third and sixth harmonics to be measured.

FIG. 9 is a block diagram illustrating an electronic circuit used for performing the above described diagnostic method. A sampling gate 220 is connected to each of the four terminals (I, A, S and F) of the voltage regulator and is commanded to gate the signals on those terminals to a tracking filter 240 by an appropriately programmed microprocessor 50. The tracking filter 240 is configured to pass the third and sixth harmonics as determined by the base input frequency $f_0$, which is derived according to the engine speed. Microprocessor 50 is programmed to convert engine speed to the base frequency that controls the tracking filter 240; to sequentially provide sampling control signals to the sample gate 220; and to process the output of the tracking filter 240 in a sequence of steps similar to those shown in FIG. 2 to provide a fault identification that is output to a display device (not shown).

It will be apparent that many modifications and variations may be implemented without departing from the scope and novel concept of this ivention. Therefore, it is intended by the appended claims to cover all such modifications and variations which fall within the true spirit and scope of the invention.

We claim:

1. A method of diagnosing component failure in a DC voltage regulator means having terminals connected to sense the voltage level output from and control the field current supplied to an associated mechanically driven DC voltage generator means including the steps of:

defining a fundamental frequency as the frequency of rotation of the mechanically driven rotor field winding of the generator means multiplied by the number of poles on the rotor;

providing means for sensing predetermined harmonics of said fundamental frequency;

selectively connecting said sensing means to terminals of said regulator means; and comparing the presence or absence of harmonic frequencies sensed at each terminal with a predetermined fault table to determine the specific faulty component in said DC voltage regulator.

2. A method as in claim 1 wherein said rotor is of the six pole variety having three stator windings and said step of comparing specifically senses the presence or absence of at least the third and sixth harmonic frequencies and includes the step of distinguishing therebetween.

3. A method as in claim 2 wherein said DC voltage regulator includes a first terminal connected to the rectified output of said generator means and to a terminal of a means for storing DC energy, a second terminal connected to a common junction of the stator windings of said generator means and a third terminal connected in series with the field winding of said generator means;

a power transistor for supplying field current from said first terminal to said third terminal;

a voltage sensing circuit including a reference diode for turning on said power transistor when the voltage level at said first terminal is below a value determined by the threshhold level of said reference diode; and wherein the failure of either said power transistor of said reference diode is determined by said method.

4. A method as in claim 3, wherein the occurrence of said power transistor being open, so as to prevent field current from being supplied to said field winding of said generator means, is detected by the absence of said harmonic frequencies being sensed at any of said second and third terminals.

5. A method as in claim 3, wherein the occurrence of said power transistor being shorted, so as to supply unregulated full current to said field winding of said generator means, is detected by sensing the presence of only said third harmonic frequency at said second terminal and the absence of said harmonic frequencies at said third terminal.

6. A method as in claim 3, wherein the occurrence of said reference diode having a low threshhold reference value, so as to prevent an appropriate flow of field current through said power transistor to said third terminal, is detected by sensing the absence of said harmonic frequencies at said second terminal and the presence of only said sixth harmonic frequency at the third terminal.

7. A method as in claim 3, wherein the occurrence of said power transistor being partially shorted, so as to supply randomly regulated current to said field winding of said generator means, is detected by sensing the presence of a high magnitude of said sixth harmonic frequency at said first terminal.

8. A method as in claim 3, wherein said DC voltage regulator further includes a fourth terminal connected to one side of a filament indicator lamp and to a normally closed voltage sensitive relay that is connected to said second terminal to sense the stator winding voltages of said generator means, wherein said voltage sensitive relay includes a rectifying diode having its anode connected to said second terminal and a storage capacitor connected between the cathode of said diode and ground to store the rectified stator voltage from said diode and provide a holding voltage for said relay when said holding voltage exceeds a predetermined value, wherein the occurrence of said storage capacitor being open and allowing said voltage sensitive relay to remain in its closed state is detected by sensing the presence of only said third harmonic frequency at said second terminal, the presence of only said sixth harmonic frequency at said third terminal and the presence of both said third and sixth harmonic frequencies at said fourth terminal.

9. A method as in claim 8, wherein the occurrence of said power transistor being open, so as to prevent field current from being supplied to said field winding of said generator means, is detected by the absence of said harmonic frequencies being sensed at any of said first, second and third terminals.

10. A method as in claim 8, wherein the occurrence of said power transistor being shorted, so as to supply unregulated full current to said field winding of said generator means, is detected by sensing the presence of only said third harmonic frequency at said second terminal and the absence of said harmonic frequencies at said third terminal.

11. A method as in claim 8, wherein the occurrence of said reference diode having a low threshhold reference value, so as to prevent an appropriate flow of field current through said power transistor to said third terminal, is detected by sensing the absence of said harmonic frequencies at said second terminal and the presence of only said sixth harmonic frequency at said third terminal.

12. A method as in claim 8, wherein the occurrence of said power transistor being partially shorted, so a to supply a randomly regulated current to said field winding of said generator means, is detected by sensing the presence of a high magnitude of said sixth harmonic frequency at said first terminal.

* * * * *